United States Patent [19]
Jarrett et al.

[11] 4,401,974
[45] Aug. 30, 1983

[54] DIGITAL SAMPLE AND HOLD CIRCUIT

[75] Inventors: Robert B. Jarrett; Wilson D. Pace, both of Tempe, Ariz.

[73] Assignee: Motorola, Inc., Schaumburg, Ill.

[21] Appl. No.: 11,354

[22] Filed: Feb. 12, 1979

[51] Int. Cl.³ ............... H03K 13/02; H03K 13/20
[52] U.S. Cl. ............... 340/347 AD; 340/347 SH;
340/347 M; 328/151; 307/353; 180/170;
180/179; 364/426
[58] Field of Search .... 340/347 M, 347 AD, 347 SH;
328/151; 307/353; 180/170, 179; 364/426

[56] References Cited
U.S. PATENT DOCUMENTS 3,216,001  11/1965  Hinrichs ............... 340/347 AD
3,940,673  2/1976  Darlington ............... 340/347 AD
4,149,256  4/1979  Sumi et al. ............... 364/602
4,160,244  7/1979  Solomon et al. ............... 340/347 DA

OTHER PUBLICATIONS

The Engineering Staff of Analog Devices, Inc., Analog-Digital Conversion Handbook, 6/72, pp. II-32 to 41; III-84, 85.
Sterling, Digital Sample-and-Hold Speeds A-D Conversion Time, Electronics Designer's Casebook, No. 3, 1979, McGraw-Hill, pp. 80-81.
The Engineering Staff of Analog Devices, Inc., Analog-Digital Conversion Handbook, 6/72, pp. II-46 to II-48.

Primary Examiner—T. J. Sloyan
Attorney, Agent, or Firm—Vincent B. Ingrassia

[57] ABSTRACT

A sample and hold circuit for an automotive speed control system is disclosed which includes a non-monotonic digital-to-analog converter suitable for fabrication as a highly dense monolithic circuit. The non-monotonic digital-to-analog converter precludes the occurrence of large positive errors in the analog output value, which might be caused by tolerance errors in the ratio of binary-weighted currents within the digital-to-analog converter, by including offsetting negative errors within the design of the digital-to-analog converter.

2 Claims, 6 Drawing Figures

DIGITAL SAMPLE AND HOLD CIRCUIT

BACKGROUND OF THE INVENTION

1. Field of the Invention

This invention relates generally to a sample and hold circuit for sampling an analog signal, and more particularly to a sample and hold circuit which employs a non-monotonic digital-to-analog converter.

2. Description of the Prior Art

A set-up circuit, or sample and hold circuit, is used primarily for storing the voltage of an analog signal at a specific moment of time. Prior art sample and hold circuits typically employ a switch connected to the analog signal which is to be sampled and a capacitor for temporarily storing the voltage of the analog signal. For example, see the sample and hold circuit described by Millman and Halkias, *Integrated Electronics: Analog and Digital Circuits and Systems*, McGraw Hill Book Company, 1972, page 570-571. However, capacitive storage type set-up circuits often are subject to "droop" which causes the stored voltage to decrease over time. If the sampled voltage must be retained for several hours, then specially designed capacitors and buffer circuitry must be used in order to avoid this "droop" effect, and system cost is correspondingly increased.

Digital techniques are known for representing an analog signal in digital form. However, if the digital representation is to be reconverted into analog form for subsequent use by other circuitry, a digital-to-analog converter is required. However, most digital-to-analog converters which have been adapted for fabrication as a monolithic integrated circuit require a relatively large die area. This is particularly true when the desired accuracy of the system requires that the digital representation include a large number of bits of information in order to accurately reproduce an analog signal. For example, an 8-bit digital-to-analog (D/A) converter typically includes a least significant current corresponding to the $2^0$ bit position and a most significant current corresponding to the $2^7$ bit position. In this case, the most significant current ideally must be 128 times as large as the least significant current. In order to accurately maintain the desired 128 to 1 ratio, an integrated circuit must typically employ either resistors having large widths or many smaller width resistors arranged in parallel. In either case, large amounts of integrated circuit die area are required in order to achieve accurate digital-to-analog conversion.

In a sample and hold circuit of the type which embodies the present invention, digital counter is pulsed periodically so as to increment the digital count. The digital count is converted to an analog output voltage by a D/A converter circuit, and the analog output voltage is then compared to the analog voltage to be sampled. When the comparison indicates that the analog output voltage has become equal to or has exceeded the analog voltage to be sampled, the counter stops incrementing.

If the sampled analog signal represents the speed of a system to be controlled, then it is important that the analog output voltage provided by the D/A converter when the counter stops incrementing not be greatly in excess of the analog voltage to be sampled. For example, if the analog voltage to be sampled is derived from a tachometer of an automobile going 55 miles per hour, it would not be permissible to generate an analog output voltage corresponding to 60 miles per hour. Since prior art D/A converters must be very accurate to prevent such errors and would therefore require large die areas resulting in higher chip costs, a sample and hold circuit employing digital techniques to store an analog voltage would not appear to be cost effective where the goal is a low cost system such as a consumer oriented integrated circuit for automotive speed control applications. Yet, the present invention utilizes a D/A converter having high circuit density but which prevents the analog output signal generated by the D/A converter from being significantly in excess of the sampled analog signal.

SUMMARY OF THE INVENTION

It is an object of the present invention to provide a digital-to-analog converter adapted for being implemented as a highly dense monolithic integrated circuit and which prevents the analog output signal from exhibiting positive incremental errors which could otherwise occur if the digital signal received by the digital-to-analog converter is incremented.

It is another object of the present invention to provide a sample and hold circuit for sampling an analog input signal which employs digital storage of the sampled signal and which can be implemented as a highly dense monolithic integrated circuit.

Another object of the present invention is to provide a sample and hold circuit which employs a digital-to-analog converter suitable for being fabricated as a portion of a highly dense monolithic integrated circuit such that the analog output signal provided by the digital-to-analog converter is prevented from being largely in excess of the analog input signal to be sampled.

These and other objects are accomplished by providing a sample and hold circuit which includes a non-monotonic digital-to-analog converter which receives a digital signal having a least-significant bit and at least one more-significant bit corresponding to a binary weighting of $2^N$. The converter includes a plurality of currents including a first current of unity magnitude and a second current having a nominal magnitude which is substantially equal to but less than $2^N$ times the unity magnitude. Switching circuitry is provided which is responsive to the least-significant and at least one more-significant bits for selectively conducting the first and second currents, and summing circuitry is provided for generating an output analog signal responsive to the selectively conducted currents. In a preferred embodiment of the present invention, the converter provides the analog output signal to a comparator for indicating whether the analog output signal is equal to or greater than an analog input signal to be sampled. The comparator is coupled to a digital counter for controlling the incrementing of the counter, and the counter provides the digital signal to the converter.

DESCRIPTION OF THE PREFERRED EMBODIMENT

Figure 1:
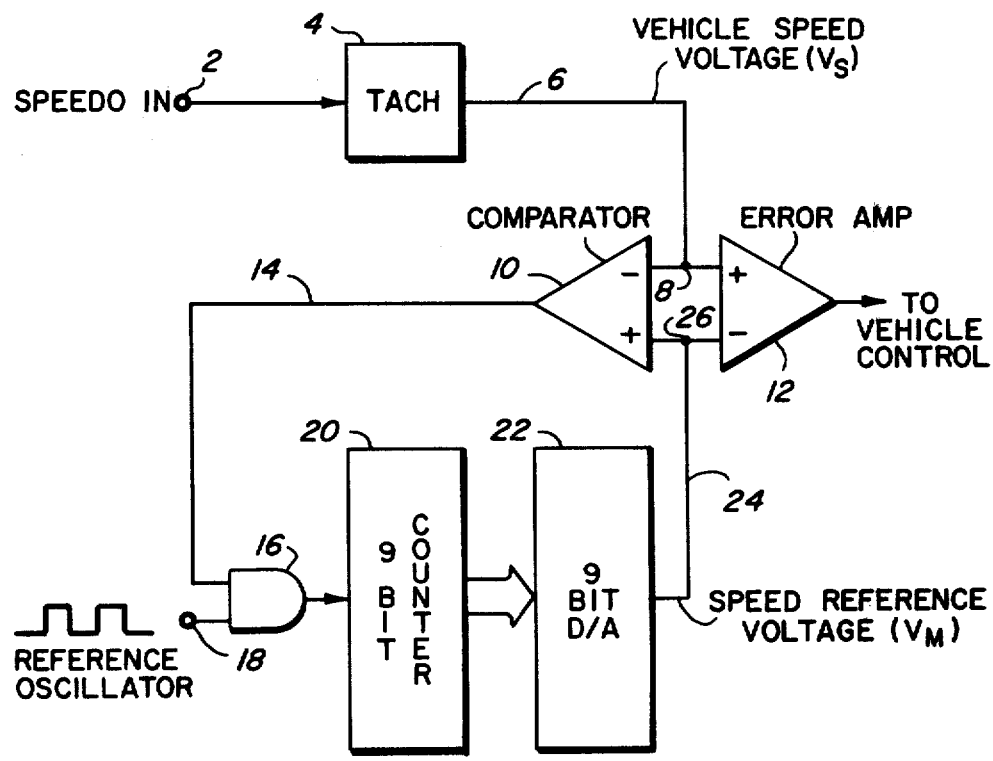
In FIG. 1, a block diagram is shown for a portion of an automotive cruise control circuit.

In FIG. 1, a portion of an automotive cruise control system is shown in block diagram form. Input terminal 2 is adapted to receive a series of electrical pulses having a pulse frequency which is directly related to the vehicle speed. The source of the series of pulses could be, for example, a mechanical breaker switch or the output of a shaft position electronic sensor. Input terminal 2 is coupled to tachometer block 4 which includes circuitry for converting the input pulse frequency to an analog voltage $V_S$, the magnitude of which is proportional to vehicle speed. One prior art approach for providing circuitry which implements the function of tachometer block 4 is disclosed in U.S. Pat. No. 4,006,417, "Tachometer," invented by W. David Pace and assigned to the assignee of the present invention. Tachometer block has an output coupled to conductor 6 for providing analog voltage $V_S$ to node 8. Node 8 is coupled to an inverting terminal of comparator 10 and to the non-inverting terminal of error amp 12. Comparator 10 may be of the type disclosed by the present invention in copending application Ser. No. 877,625, "Differential to Single-Ended Converter Utilizing Inverted Transistors," filed Feb. 14, 1978 and assigned to the assignee of the present invention. The output of comparator 10 is coupled by conductor 14 to a first terminal of logical AND gate 16. Terminal 18 is coupled to the second input terminal of logical AND gate 16 and is adapted to receive periodic pulses from a reference oscillator. The output of AND gate 16 is coupled to the clock input of 9-bit counter 20. In the preferred embodiment, counter 20 is implemented with integrated-injection-logic (I²L) circuitry, and the digital count is incremented by one each time that a clock pulse is received from the output of AND gate 16. Exemplary circuitry of a flip-flop suitable for constructing a digital counter with I²L techniques may be found in "I²L Takes Bipolar Integration A Significant Step Forward" by Horton et al, Electronics, Feb. 6, 1975, pp 83–90. Counter 20 provides the present count in the form of a digital signal to 9-bit D/A converter block 22, the details of which will be further described hereinafter. D/A block 22 generates a speed reference voltage $V_M$ in response to the received digital signal. The speed reference voltage is output by D/A converter block 22 onto conductor 24 which is coupled to node 26. Node 26 is coupled to the non-inverting terminal of comparator 10 and also to the inverting terminal of error amp 12.

The overall function of the block diagram shown in FIG. 1 will now be briefly described. The tachometer output voltage $V_S$ is proportional to the actual vehicle speed. Counter 20 and D/A block 22 create a reference voltage $V_M$ proportional to the driver's desired speed. This reference voltage is established during speed control set-up by clocking counter 20 to increment D/A block 22 until output voltage $V_M$ equals the tachometer output voltage $V_S$. Counter 20 is then latched so as to store the digital value which corresponds to the desired speed reference voltage. After set-up, error amplifier 12 compares speed reference voltage $V_M$ at node 26 with the vehicle speed voltage $V_S$ at node 8 to generate an error signal. The error signal generated by error amplifier 12 may then be used for controlling a throttle positioning servo (not shown) for correcting the vehicle speed.

In the particular application of the invention in an automotive cruise control system, all of the blocks shown in FIG. 1 plus other circuitry (not shown) are formed within a single monolithic integrated circuit chip. In this particular application, acceptable speed control set-up accuracy requires that the D/A output be incremented in steps smaller than one-half miles per hour. This corresponds to adapting counter 20 and D/A converter 22 (see FIG. 1) for producing speed reference voltages within 8-bits of resolution. However, a typical prior art D/A converter which achieves 8-bit accuracy requires approximately 10,000 square mils of chip area. In contrast, 9-bit D/A converter 22 requires only 2,000 square mils of chip area when the set-up and hold circuit shown in FIG. 1 is constructed according to the present invention.

Figure 2:
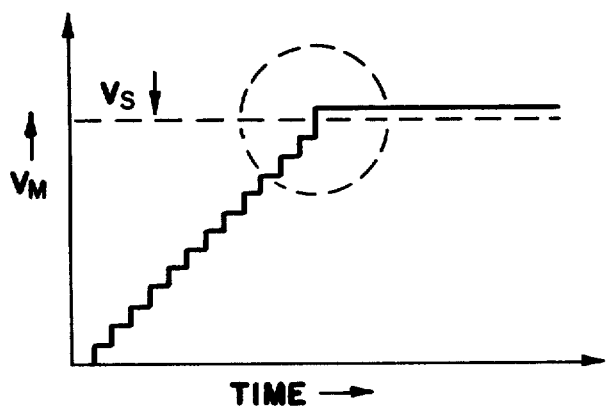
FIG. 2 is a graph which shows the stepped analog output voltage $V_M$ generated by a D/A converter which is driven from a periodically incremented counter.

The operation of the sample and hold circuitry shown in FIG. 1 will now be discussed with reference to FIG. 2. Upon the vehicle achieving the desired speed, the operator of the vehicle actuates a switch which causes counter 20 to be reset. At the starting time at which counter 20 is reset, all of the bits in the digital count are zero, and D/A converter 22 outputs voltage $V_M$ having zero magnitude as shown initially in FIG. 2. Comparator 10 senses that voltage $V_M$ is less than the actual vehicle speed voltage $V_S$ and provides a logic "1" level output which enables AND gate 16. While AND gate 16 is enabled, clock pulses received by terminal 18 are coupled to the clock input of counter 20 which results in the digital count being incremented by one as each clock pulse is received. As the digital count is incremented, the reference voltage $V_M$ generated by D/A converter 22 increases in magnitude as is shown in FIG. 2. At a later point in time, voltage $V_M$ exceeds voltage $V_S$, and the output of comparator 10 switches to a logic "0" level which disables AND gate 16 and prohibits further clock pulses from being received by counter 20. At this time, speed reference voltage $V_M$ is stabilized as is indicated within the circled portion of FIG. 2.

Figure 3:
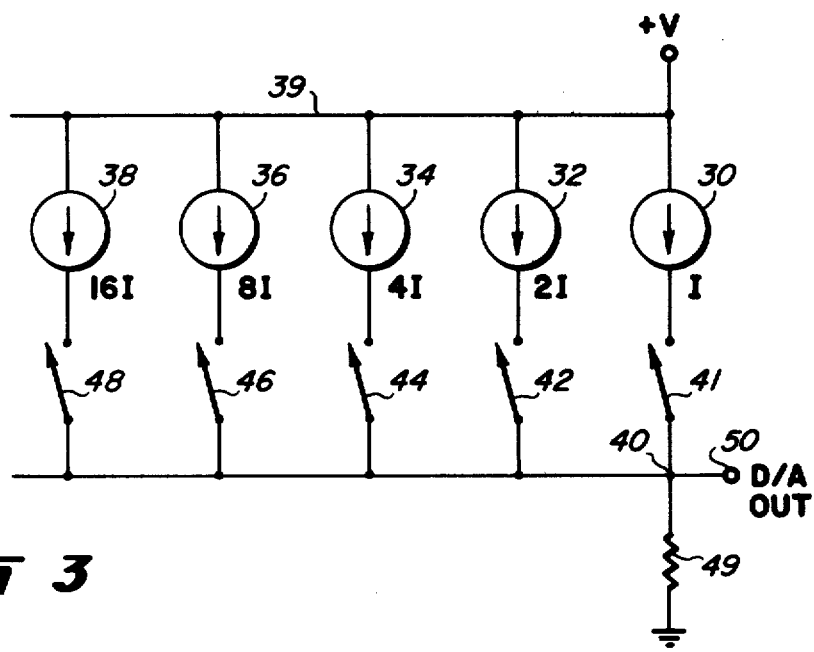
FIG. 3 is a simplified circuit drawing of a D/A converter of the general type employed by the present invention.

In FIG. 3, a simplified D/A converter circuit is shown which will be discussed with reference to FIGS. 4 and 5. For purposes of illustration, it will be assumed that current sources 30, 32, 34, 36, and 38 provide currents having magnitudes I, 2 I, 4 I, 8 I, and 16 I respectively, in standard binary-weighted format. Each of the current sources is coupled to conductor 39 which is adapted for connection to a positive supply voltage. Switch 41 is responsive to the least significant bit of an input digital signal for coupling current source 30 to node 40 whenever the least significant bit is a logic "1" level. Similarly, switches 42, 44, 46, and 48 are responsive to bits having binary weighting of 2, 4, 8, and 16, respectively, for coupling current sources 32, 34, 36, and 38 to node 40, respectively. The currents which are coupled to node 40 are conducted to ground potential by resistor 49 for generating an output voltage at terminal 50.

With respect to FIG. 3, if it is now assumed that each of the current sources is subject to a ten percent variation in current due to tolerance errors, then it is possible for current source 38 to actually provide a current of magnitude 17.6 I (16 I plus 1.6 I) under worst case conditions. It will also be assumed that the currents provided by current sources 30, 32, 34, and 36 are equal to the nominally designed magnitudes. Thus, when switch 48 is open but switches 41, 42, 44 and 46 are closed, then the voltage at terminal 50 is 15 IR, where R is the value of resistor 49. However, if the digital count is incremented such that switch 48 is now closed and switches 41, 42, 44, and 46 are opened, then the magnitude of the voltage at terminal 50 jumps to 17.6 IR. If it is assumed that the voltage $V_S$ output from tachometer 4 (FIG. 1) is slightly in excess of the voltage represented by 15 IR, then counter 20 will be incremented and the output of D/A converter 22 would jump to 17.6 IR before prohibiting further clock pulses from incrementing counter 20. The above described positive D/A error is illustrated graphically in FIG. 4. In the example described, the positive D/A error is the difference between the actual control speed reference voltage $V_M$, 17.6 IR and the voltage which would nominally be produced by current source 38 under ideal conditions, 16 IR. The graph in FIG. 4 also illustrates the speed error, or the difference between the actual control speed reference voltage $V_M$ and the voltage corresponding to the desired speed $V_S$.

The simplified D/A converter shown in FIG. 3 shows only the current sources which correspond to the five lesser significant bits of the digital signal. If the simplified D/A converter of FIG. 3 were expanded for being compatible with an 8-bit digital signal, then the current source corresponding to the most significant bit would ideally provide a current having a magnitude of 128 I. A goal of the automotive cruise control system illustrated in FIG. 1 is to prevent the speed error from being in excess of the incremental voltage due to the least-significant bit (IR). Yet a 10 percent tolerance error in this current would result in a positive D/A error in excess of 12 IR, which is much larger than the incremental voltage due to the least significant bit. Of course, large positive D/A errors may be avoided by constructing a highly accurate D/A converter having very small tolerance errors. However, as previously mentioned, highly accurate D/A converters require large amounts of chip area.

Figure 4:
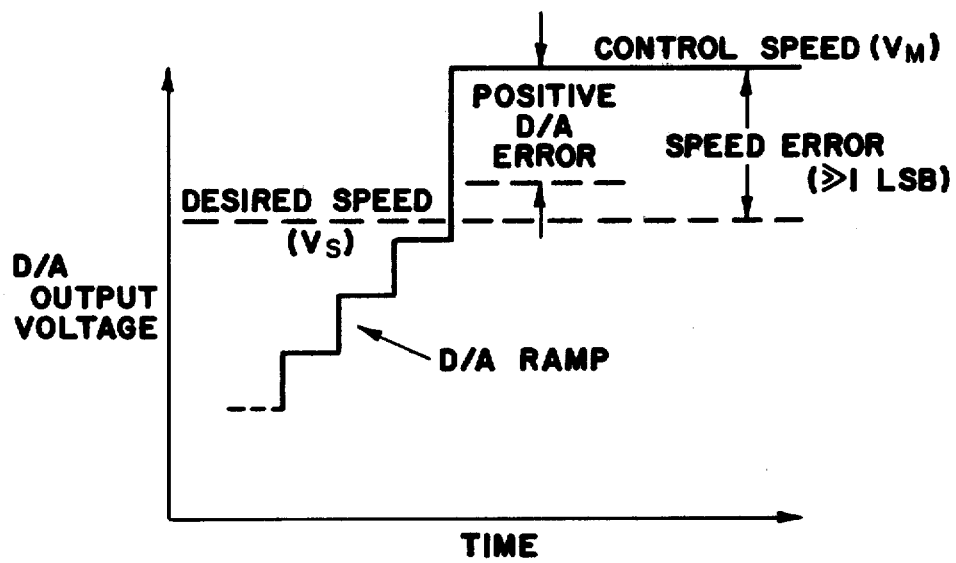
FIG. 4 is a graph which highlights a portion of the area shown in the graph of FIG. 2 and illustrates the effects of a positive D/A error.
Figure 5:
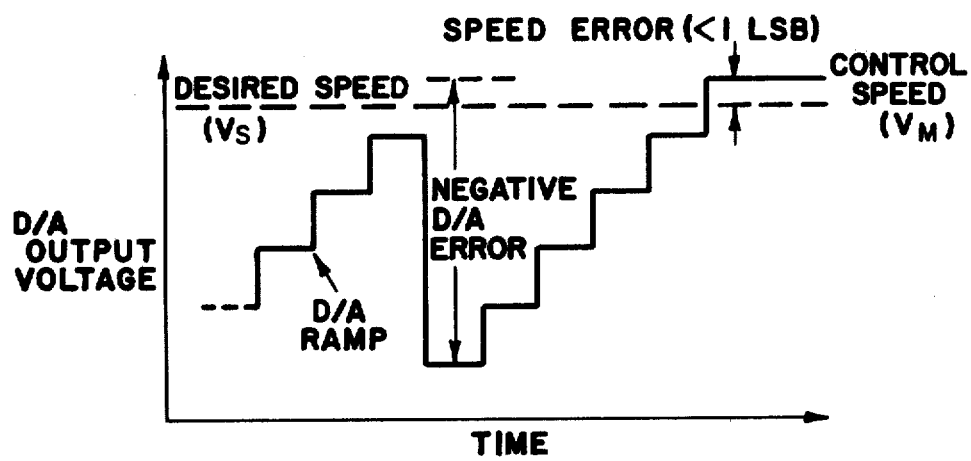
FIG. 5 is a graph which shows a portion of the graph in FIG. 2 and illustrates negative D/A error employed by the present invention.

Although large positive D/A errors produce unacceptible set-up accuracy as is shown in FIG. 4, negative D/A errors do not affect set-up accuracy because counter 20 (FIG. 1) continues to increment the digital signal which is input to D/A converter 22 until the negative error is overcome. The present invention recognizes that a satisfactory D/A converter for speed control can be implemented utilizing minimum geometry devices and small non-precision resistors provided that the output characteristic of the D/A converter is modified in order to prohibit positive D/A errors. This is accomplished by intentionally generating negative errors larger than the worst case positive errors experienced with the highly dense but relatively inaccurate D/A components. In the preferred embodiment, a ninth bit is added to an 8-bit D/A converter in order to compensate for the dynamic range lost to these intentional negative errors.

In order to illustrate the utilization of negative errors in order to compensate for positive errors, it will be assumed that current source 38 in FIG. 3 is modified so as to provide a current having a nominal magnitude of, for example, 14 I rather than 16 I. If it is again assumed that the tolerance error on current source 38 is 10 percent, then the maximum magnitude of the current provided by current source 38 is 15.4 I. When switch 48 is open and switches 41, 42, 44 and 46 are closed, then the output voltage is 15 IR. Under worst case conditions, the output voltage will increase to 15.4 IR when the digital count is incremented causing switch 48 to close and switches 41, 42, 44, and 46 to open. In this case, no positive D/A error can occur since the output voltage merely changes from 15 IR to 15.4 IR. Under nominal conditions, the voltage output by the D/A converter will actually decrease from 15 IR to 14 IR upon the opening of switches 41, 42, 44, and 46 and the closing of switch 48 resulting in a negative D/A error as is shown in FIG. 5. This negative erorr is of no concern in that the counter is incremented further, initially closing least significant switch 41 and subsequently other combinations of the lesser significant switches until the negative error is overcome. As is shown in FIG. 3, voltage $V_M$ output by the D/A converter will eventually exceed voltage $V_S$, and the counter will then stop incrementing.

The preferred embodiment of the D/A converter according to the present invention is non-monotonic in that incrementing the digital count may actually decrease the magnitude of the analog voltage output by the D/A converter. It is nonetheless ideally suited for highly dense circuit fabrication within a monolithic integrated circuit and allows the sample and hold circuit to generate the control speed voltage $V_M$ with less than one least significant bit of error from the desired speed voltage $V_S$.

Figure 6:
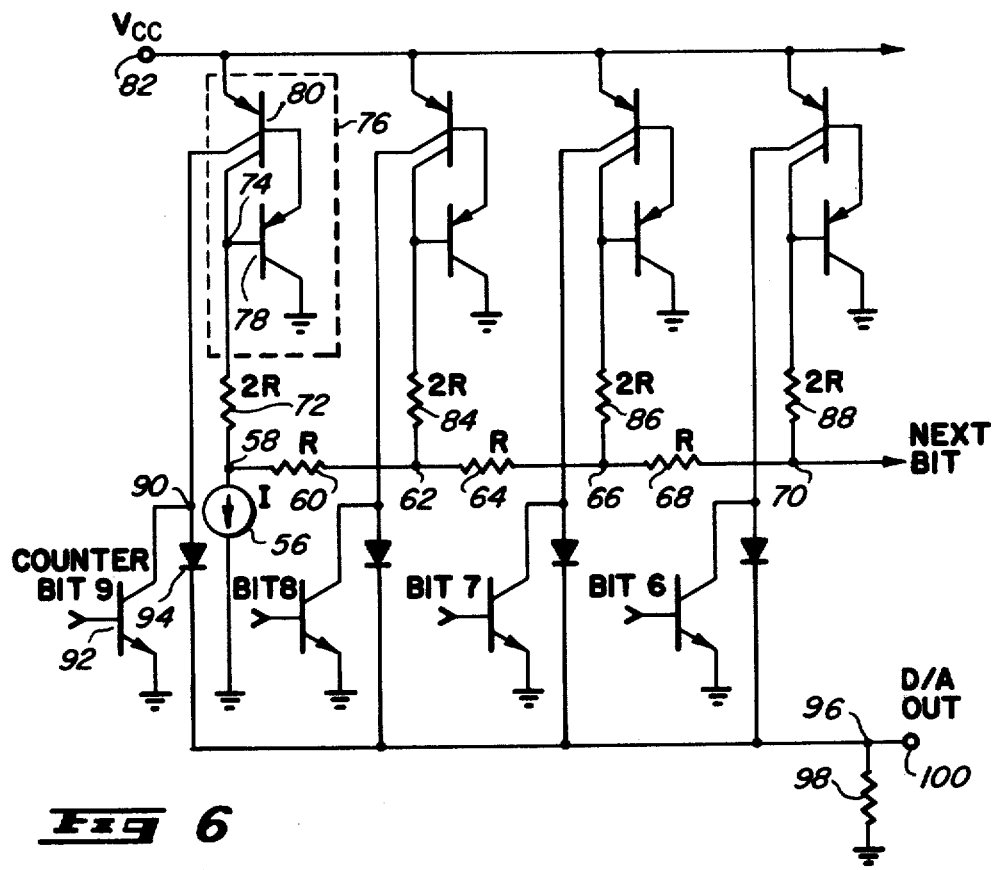
FIG. 6 is circuit schematic of a non-monotonic D/A converter according to the present invention.

FIG. 6 is a circuit schematic of a D/A converter according to a preferred embodiment of the invention. The portion of the D/A converter shown in FIG. 6 illustrates the circuitry responsive to the four most significant bits of the digital signal. Reference current source 56 is coupled between node 58 and ground potential and conducts reference current I. Resistor 60 is coupled from node 58 to node 62 and has a magnitude R. Register 64, also of magnitude R, is coupled from node 62 to node 66. Resistor 68, also of magnitude R, is coupled between node 66 and node 70. Resistors 60, 64, and 68 are arranged in the series branch of an R, 2R ladder network. In a first parallel branch of the ladder network, resistor 72 of magnitude 2R is coupled from node 58 to node 74 of a turn-around circuit shown within dashed box 76. The turn-around circuit includes transistor 78 which has its collector electrode coupled to ground potential and its base electrode coupled to node 74. The emitter electrode of transistor 78 is coupled to the base electrode of dual collector transistor 80. The emitter electrode of transistor 80 is coupled to positive supply voltage terminal 82 which receives positive supply voltage $V_{CC}$. A first collector electrode of transistor 80 is coupled to node 74.

Similarly node 62 is coupled to a like turn-around circuit by resistor 84 of magnitude 2R. Nodes 66 and 70 are also coupled to like turn-around circuits by resistiors 86 and 88, respectively. The voltage at node 74 is two base-emitter voltage drops below the voltage at supply terminal 82. Similarly, resistors 84, 86, and 88 are each coupled to a voltage within the associated turn-around circuit which is two base-emitter voltage drops below the voltage at supply terminal 82. In an ideal R, 2R ladder network, reference current I splits equally such that resistor 72 and resistor 60 each conduct a current of magnitude I/2. The current conducted by resistor 60 splits again at node 62 such that resistor 84 and resistor 64 each conduct current of magnitude I/4. This current splitting process continues in subsequent stages of the ladder network. Since transistors 78 and 80 are identical to the corresponding transistors in subsequent turn-around circuits and since the emitter currents in transistors 78 and 80 are larger than the corresponding emitter currents in subsequent turn-around circuits, the base-emitter voltage drops associated with transistors 78 and 80 are larger than those for corresponding transistors in subsequent turn-around circuits. Therefore, those skilled in the art will realize that the current conducted by resistor 72 will actually be less than the theoretical I/2 value because node 74 will be less positive than the corresponding nodes in subsequent turn-around circuits. Another reason that node 74 is less positive than corresponding nodes in other turn-around circuits relates to the beta ($\beta$) falloff characteristics of minimum geometry devices at higher current densities. The base electrode of transistor 80 must be more than double the base electrode current of a corresponding transistor if transistor 80 is to conduct double the collector electrode current conducted by the corresponding transistor such that the base-emitter voltage drop of transistor 78 is even larger than it would otherwise be.

Therefore, resistor 72 conducts a current of magnitude somewhat less than I/2, resistor 84 conducts a current of magnitude somewhat less than I/4, and so forth. The negative errors of the current magnitudes relative to ideal binary-weighted current magnitudes are designed such that the negative errors are sufficient to compensate for tolerance errors that would tend to increase the current in any particular branch above the ideal binary-weighted current magnitude.

A second collector electrode of transistor 80 is coupled to node 90. In the preferred embodiment, the collector regions of the first and second collectors of transistor 80 are scaled equally in area such that the current conducted by the second collector electrode equals the current conducted by the first collector electrode. Since the base current conducted by transistor 78 is negligible relative to the current conducted by the first collector electrode of transistor 80, it may be assumed that the current conducted by the second collector electrode of transistor 80 is substantially equal to the current conducted by resistor 72.

Node 90 is coupled to the collector electrode of switching transistor 92 and to the anode of diode 94. The emitter electrode of transistor 92 is coupled to ground potential, and the base electrode is responsive to the most significant bit of the digital signal such that transistor 92 is conductive or nonconductive depending upon the most significant bit being in the logic "1" or logic "0" state, respectively. The cathode of diode 94 is coupled to node 96, and resistor 98 is coupled between node 96 and ground potential. When transistor 92 is nonconductive, diode 94 allows the current conducted by the second collector electrode of transistor 80 to flow through resistor 98. Similar switching transistors and coupling diodes are provided for subsequent stages of the D/A converter such that an analog output voltage is generated at node 96 which is proportional to the current conducted by summing resistor 98. The analog voltage generated at node 96 is coupled to output terminal 100 for providing the reference voltage $V_S$.

Although the circuitry responsive to bits one through five is not shown in FIG. 6, this circuitry can be similar to that shown for the more significant bits in order to complete the R, 2R ladder network. Those skilled in the art however will realize that negative errors need not necessarily be designed into those lesser significant bit stages for which positive D/A errors are smaller in magnitude than the change in output voltage effected by the least significant bit. In the preferred embodiment, the three least significant bit currents are generated by the use of a standard current mirror arrangement which is well known in the art. A dummy resistor of magnitude of 2R coupled to a dummy turn-around circuit is also employed for terminating the R, 2R ladder network in the proper impedance.

While the invention has been described with reference to a preferred embodiment, the description is for illustrative purposes only and is not to be construed as limiting the scope of the invention. Various modifications and changes may occur to those skilled in the art without departing from the true spirit and scope of the invention as defined in the appended claims.

What is claimed is:

1. A circuit for sampling and holding an analog voltage, comprising:
   (a) comparator means having a first input for receiving an analog input signal, a second input for receiving an analog output signal, and an output for providing a comparison signal when the analog output signal is equal to or greater than the analog input signal;
   (b) counter means for providing a digital value and adapted to receive clocking pulses for incrementing the digital value, said counter means including an input coupled to the output of said comparator means for preventing the digital value from being further incremented upon the occurrence of said comparison signal, the digital value having a least-significant bit corresponding to a binary weighting of $2^0$ and at least one more-significant bit corresponding to a binary weighting of $2^N$, where N is an integer greater than 0; and
   (c) converter means having an input coupled to said counter means for receiving the digital value and an output coupled to the second input of said comparator means for providing the analog output signal, said converter means being responsive to the least-significant bit of the digital value for effecting a change in the magnitude of the analog output signal by a unity amount, said converter means being responsive to the at least one more-significant bit for effecting a change in the magnitude of the analog output signal by an amount less than $2^N - 1$ times said unity amount.

2. A circuit as recited in claim 1 wherein said converter means comprises:
   (a) a plurality of current means for providing a corresponding plurality of currents each having a magnitude, said plurality of current means including a first current means for providing a first current of unity magnitude and at least a second current means for providing a second current;
   (b) switching means coupled to the input of said converter means and to said plurality of current means, said switching means being responsive to said least-significant bit and to said one more-significant bits for selectively conducting said first and second currents, respectively; and
   (c) summing means coupled to said switching means and responsive to the current selectively conducted by said switching means for generating the analog output signal.

* * * * *